(12) United States Patent
Rosen et al.

(10) Patent No.: US 8,818,004 B2
(45) Date of Patent: Aug. 26, 2014

(54) CONDENSER MICROPHONE

(75) Inventors: Guenter Rosen, Wedemark (DE); Alexander Nowak, Wedemark (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 814 days.

(21) Appl. No.: 12/921,772

(22) PCT Filed: Mar. 10, 2009

(86) PCT No.: PCT/EP2009/001712
§ 371 (c)(1),
(2), (4) Date: Dec. 3, 2010

(87) PCT Pub. No.: WO2009/112241
PCT Pub. Date: Sep. 17, 2009

(65) Prior Publication Data
US 2011/0075863 A1  Mar. 31, 2011

(30) Foreign Application Priority Data

Mar. 10, 2008  (DE) .......................... 10 2008 013 395

(51) Int. Cl.
  *H04R 3/00* (2006.01)
  *H04R 19/04* (2006.01)
  *H04R 31/00* (2006.01)
  *H05K 1/14* (2006.01)

(52) U.S. Cl.
  CPC .............. *H04R 19/04* (2013.01); *H04R 31/006* (2013.01); *H05K 1/147* (2013.01)
  USPC ............. 381/111; 381/369; 381/91; 381/355; 381/150; 381/174

(58) Field of Classification Search
  USPC ......... 381/111, 112, 113, 116, 355, 361, 365, 381/369, 174, 175, 176, 178, 91, 92; 181/148, 157, 158, 167, 168, 171
  See application file for complete search history.

(56) References Cited

U.S. PATENT DOCUMENTS

| | | | |
|---|---|---|---|
| 7,697,707 B2 * | 4/2010 | Akino | 381/369 |
| 2003/0076970 A1 * | 4/2003 | van Halteren et al. | 381/191 |

FOREIGN PATENT DOCUMENTS

| | | |
|---|---|---|
| DE | 4329993 A1 | 3/1995 |
| DE | 19929179 A1 | 1/2001 |
| DE | 102007004096 A1 | 9/2007 |
| EP | 0397975 A2 | 11/1990 |
| EP | 1251713 A2 | 10/2002 |
| EP | 1298958 A2 | 4/2003 |
| EP | 1303164 A2 | 4/2003 |
| GB | 2231235 A | 11/1990 |
| WO | WO 00/27166 A2 | 5/2000 |

OTHER PUBLICATIONS

International Search Report for PCT Application No. PCT/EP2009/001712 mailed on Jul. 27, 2009; 3 pages.
Written Opinion or PCT Application No. PCT/EP2009/001712 mailed on Jul. 27, 2009; 3 pages.

* cited by examiner

*Primary Examiner* — Leshui Zhang
(74) *Attorney, Agent, or Firm* — Kilpatrick Townsend & Stockton LLP

(57) ABSTRACT

There is provided a capacitor microphone comprising a microphone capsule (100), which has an at least partially electrically conductive diaphragm (110) and a counterelectrode (120) associated therewith. The counterelectrode (120) has a printed circuit board (21) having a carrier of an insulating material (121*a*) and at least one electrically conductive surface (121*b*).

4 Claims, 2 Drawing Sheets

CONDENSER MICROPHONE

CROSS-REFERENCE TO RELATED APPLICATIONS

Figure 1:
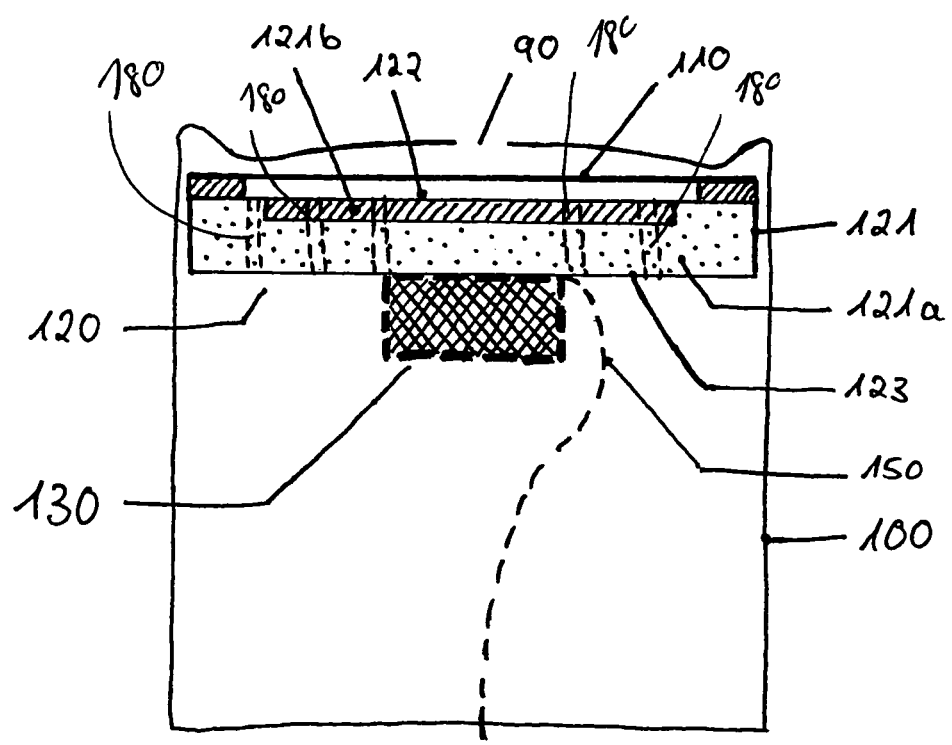

This application is a U.S. National Stage of PCT Application No. PCT/EP2009/001712 filed Mar. 10, 2009, which claims the benefit of German Application No. 102008013395.7 filed Mar. 10, 2008, the contents of both applications hereby incorporated by reference in their entirety for all purposes.

The invention concerns a capacitor microphone.

A capacitor microphone is an electroacoustic transducer which converts sound pressure impulses into corresponding electrical voltage pulses. The structure of such a capacitor microphone is described for example in T Görne, 'Mikrofon in Theorie and Praxis', Elektor-Verlag, Aachen, 1994.

In a capacitor microphone a thin electrically conductive diaphragm acts as an electrode of a plate capacitor. The counterelectrode forms a metal plate—often perforated for acoustic reasons—which is mounted in electrically insulated relationship at a small spacing relative to the diaphragm. The capacitance C of the capacitor is dependent on the plate area A and the spacing d of the capacitor plates.

Due to a sound acting thereon the diaphragm oscillates in front of the counterelectrode, resulting in a change in the spacing d of the two capacitor plates and thus a change in the capacitance C of the capacitor. To convert those changes in capacitance into an output voltage, a so-called low frequency circuit is used in a LF capacitor microphone. For that purpose the capacitor is connected in series with a high-ohmic charging resistor and charged to a defined dc voltage by way of a voltage supply. A change in the capacitor capacitance C, caused by the oscillation of the diaphragm, leads to a proportional voltage drop at the capacitor, which can be taken off as a change in voltage at the charging resistor. A downstream-connected impedance-converting microphone amplifier (impedance converter) adapts the extremely high internal resistance of the microphone to the input resistance of a subsequent amplifier stage, that is to say the impedance converter makes the output signal low-ohmic.

Because of the high-ohmic structure of such an electroacoustic transducer and because of the very small spacing between the diaphragm and the counterelectrode it is important for the counterelectrode to be very precisely worked and for it to be very well insulated relative to the reference potential (ground). It is also important for the surface of the counterelectrode to be extremely flat and free from flexural deflections.

A typical process for the production of high-quality counterelectrodes operates as follows: the counterelectrode is produced in the form of a turned member and provided with bores. An outer ring is turned. The two parts are centered relative to each other and aligned. Insulating material is injected into the annular gap, thereafter the two parts are faced relative to each other and then lapped. Finally the contacting means for the counterelectrode is fitted. That procedure ensures a flat planar surface on the counterelectrode. The production procedure however is highly complicated and thus costly.

In very simple capacitor microphones stamped counterelectrodes are also used. These are admittedly very inexpensive to produce but they are not flat and of high quality like electrodes which have been produced in accordance with the above-described turning process. In conjunction with a greater spacing between the diaphragm and the counterelectrode therefore microphones which admittedly can also be used can be produced, but reductions in quality (sensitivity of the microphone, signal-noise ratio, scatter of the electroacoustic characteristic values and so forth) are however considerable.

DE 10 2007 004 096 A1 discloses a capacitor microphone having a stack comprising an electric printed circuit board, a backplate substrate with a backplate, a spacer and a diaphragm carrier frame for carrying the diaphragm.

DE 199 29 179 A1 discloses a flexible printed circuit board with an access at both sides.

Therefore the object of the present invention is to provide less expensive, high-quality counterelectrodes for capacitor microphones and corresponding capacitor microphones.

That object is attained by a capacitor microphone and by a microphone capsule as set forth in the claims.

Thus there is provided a capacitor microphone comprising a microphone capsule, which has an at least partially electrically conductive diaphragm and a counterelectrode associated therewith. The counterelectrode has a printed circuit board with a carrier of an insulating material, on which there is at least one electrically conductive surface.

Thus there is provided a capacitor microphone having a counterelectrode as a single structural unit. Instead of previously separate units such as backplate and electronic printed circuit board therefore only a single unit is employed, in the form of the printed circuit board, as the counterelectrode. In that case the printed circuit board has an insulating carrier and electrically conductive surfaces on the carrier.

The invention concerns the notion of providing a capacitor microphone in which, instead of a counterelectrode produced in accordance with one of the two above-described processes, a printed circuit board having a carrier of insulating material and at least one electrically conductive surface is used for the counterelectrode. Such printed circuit boards are known from microelectronics, where they serve for mechanical fixing and electrical connection of electronic components. Modern printed circuit boards are sufficiently flat to be used for the counterelectrode in a capacitor microphone. The insulating properties of the carrier materials are also excellent, particularly if ceramic is used for same. The printed circuit boards can be fully automatically produced in inexpensive processes. In addition, in comparison with the counterelectrodes produced in the above-described turning process, there is the advantage that any contours can be imparted to the at least one electrically conductive surface of the printed circuit board. That permits for example corrections in the frequency response characteristic.

In an aspect of the invention the microphone capsule has an impedance converter and optionally an electrical level reduction circuit. The impedance converter is particularly effectively protected from moisture due to the position in the interior of the microphone capsule. In addition this structure affords the advantage that the electroacoustic transducer inclusive of the impedance converter can be subjected to preliminary checking as a structural unit.

In a further aspect of the invention the counterelectrode has a first side which is towards the diaphragm and a second side on which the impedance converter is disposed. Mounting the impedance converter as a surface-mounted component on the counterelectrode means that the connection between the counterelectrode and the input of the impedance converter is very short and as a printed conductor path is also extremely insensitive to solids-transmitted sound. There is also the advantage that the connection between the microphone capsule constructed in that way and a subsequent amplifier stage is low-ohmic and thus extremely insensitive to moisture and excitation by solids-transmitted sound.

In an aspect of the invention the microphone capsule further has a flexible printed circuit board on which the impedance converter is mounted and which electrically contacts the counterelectrode. Mounting the impedance converter on an additional flexible circuit board or a star-flexible circuit board provides that the input of heat due to the soldering operation is kept away from the actual counterelectrode. That prevents flexing phenomena due to thermally induced stresses in the insulating carrier material or in the at least one electrically conductive surface of the printed circuit board.

In a further aspect of the invention the impedance converter is connected to a flexible printed circuit board or a flexible connector or a star flexible printed circuit board which is passed out of the microphone capsule. That minimises the wiring complication and expenditure and simplifies the electrical connection of the impedance converter to further components outside the microphone capsule, for example a subsequent amplifier stage.

The invention also concerns a use of a printed circuit board having a carrier of insulating material and at least one electrically conductive surface for a counterelectrode in a capacitor microphone.

The invention also concerns a microphone capsule for a capacitor microphone having an at least partially electrically conductive diaphragm and a counterelectrode associated therewith. The counterelectrode has a printed circuit board having a carrier of insulating material and at least one electrically conductive surface.

The invention concerns various kinds of capacitor microphones, in particular capacitor microphones with low-frequency circuitry (referred to as LF capacitor microphones), capacitor microphones with high-frequency circuitry (referred to as HF capacitor microphones) and so-called electret capacitor microphones.

Further aspects of the invention are subject-matter of the appendant claims.

The advantages and embodiments by way of example of the invention are described in greater detail hereinafter with reference to the drawings.

Figure 2:
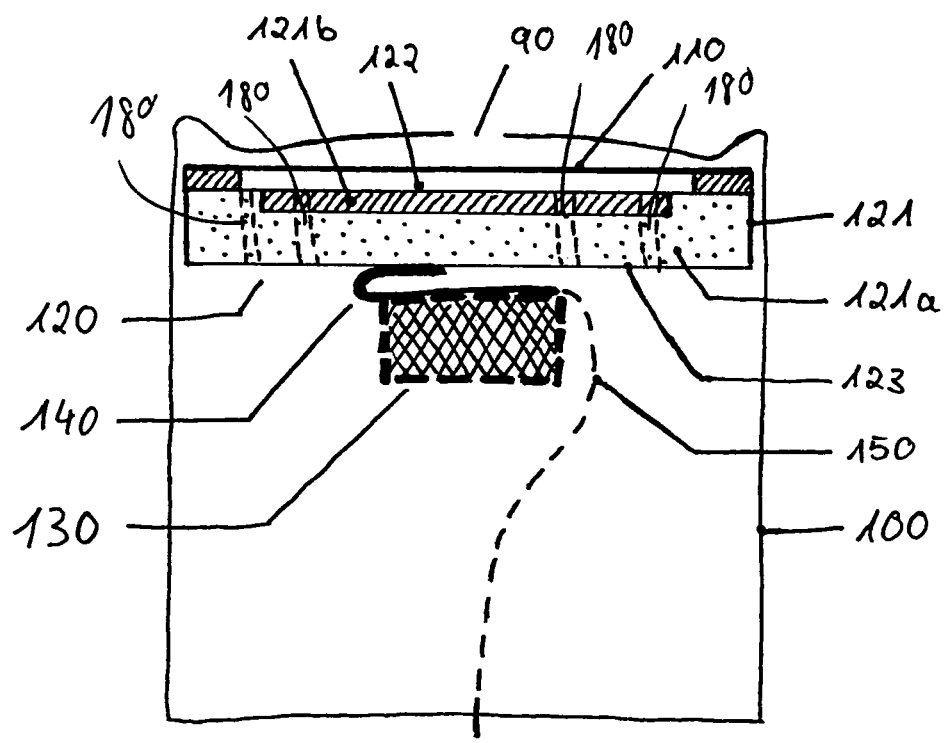

FIG. 1 shows a diagrammatic cross-section through a microphone capsule for a capacitor microphone in accordance with a first embodiment, and FIG. 2 shows a diagrammatic cross-section through a microphone capsule for a capacitor microphone in accordance with a second embodiment.

FIG. 1 shows a diagrammatic cross-section through a microphone capsule 100 for a capacitor microphone in accordance with a first embodiment. In the front region the microphone capsule 100 has at least one sound inlet opening 90—also referred to as the speaking hole—, through which sound can pass into the internal front space of the microphone capsule 100. The microphone capsule 100 further has an at least partially electrically conductive diaphragm 110 and a counterelectrode 120 associated therewith, which are disposed at a small spacing from each other in electrically insulated relationship. The counterelectrode 120 is in the form of or is implemented as a printed circuit board 121 having a carrier of insulating material 121a and at least one electrically conductive surface 121b (on the insulating material 121a). The at least one electrically conductive surface together with the at least partially electrically conductive diaphragm forms a plate capacitor, the capacitance of which changes when the diaphragm is caused to oscillate by the sound acting thereon. Holes or bores 180 can be provided in the printed circuit board 121.

Such printed circuit boards are known from microelectronics where they serve for mechanical fixing and electrical connection of electronic components. Modern printed circuit boards are sufficiently flat for them to be used for the counterelectrode in a capacitor microphone. The insulating properties of the carrier materials are also excellent, particularly if ceramic is used for same. The printed circuit boards can be fully automatically produced in inexpensive processes. In addition, in comparison with the counterelectrodes produced in the above-described turning process, there is the advantage that any contours can be imparted to the at least one electrically conductive surface of the printed circuit board. That makes it possible for example to provide for corrections of the frequency response characteristic.

The microphone capsule 100 can also have an impedance converter 130.

Due to the position in the interior of the microphone capsule 100 the impedance converter 130 is particularly effectively protected from moisture. In addition with this structure there is the advantage that the electroacoustic transducer (110, 120) inclusive of the impedance converter 130 can be subjected to preliminary checking as a structural unit.

The counterelectrode 120 can have a first side 122 which is towards the at least partially electrically conductive diaphragm 110 and a second side 123 on which the impedance converter 130 is mounted.

Mounting the impedance converter 130 as a surface-mounted component on the counterelectrode 120 means that the connection between the counterelectrode 120 and the input of the impedance converter 130 is very short and as a printed conductor path is also extremely insensitive to solids-transmitted sound. There is also the advantage that the connection between the microphone capsule 100 of that structure and a subsequent amplifier stage (not shown) is low-ohmic and thus extremely insensitive to moisture and excitation by solids-transmitted sound.

FIG. 2 shows a diagrammatic cross-section through a microphone capsule 100 for a capacitor microphone in accordance with a second embodiment. In the front region the microphone capsule 100 also has at least one sound inlet opening 90—also referred to as the speaking hole—, through which sound can pass into the internal front space of the microphone capsule 100. The microphone capsule 100 further has an at least partially electrically conductive diaphragm 110 and a counterelectrode 120 associated therewith, which are disposed at a small spacing from each other in electrically insulated relationship. As in the first embodiment the counterelectrode 120 is in the form of or is implemented as a printed circuit board 121 having a carrier of insulating material 121a and at least one electrically conductive surface 121b (on the insulating material 121a). The at least one electrically conductive surface together with the at least partially electrically conductive diaphragm forms a plate capacitor, the capacitance of which changes when the diaphragm is caused to oscillate by the sound acting thereon. Holes or bores 180 can be provided in the printed circuit board 121.

The microphone capsule 100 also has an impedance converter 130.

In contrast to the first embodiment however the impedance converter 130 is not disposed on the second side 123 of the counterelectrode 120 in the form of a surface-mounted component but the microphone capsule 100 also has a flexible printed circuit board 140 or a star flexible printed circuit board on which the impedance converter 130 is disposed and which electrically contacts the counterelectrode 120.

By mounting the impedance converter 130 to an additional flexible printed circuit board 140 or the star flexible printed board the input of heat due to the soldering operation is kept away from the actual counterelectrode 120. That prevents flexural deflections due to thermally induced stresses in the insulating carrier material 121*a* or in the at least one electrically conductive surface 121*b* of the printed circuit board 121.

A third embodiment of the invention is based on one of the first two embodiments, wherein the impedance converter 130 is electrically connected to a flexible printed circuit board 150 or a star flexible printed circuit board which is passed out of the microphone capsule 100.

That minimises the wiring complication and expenditure and simplifies the electrical connection of the impedance converter 130 to further components outside the microphone capsule 100, for example to a subsequent amplifier stage (not shown).

The invention claimed is:

1. A microphone capsule for a capacitor microphone, the microphone capsule comprising:
   a housing;
   a sound inlet opening;
   an at least partially electrically conductive diaphragm arranged towards the sound inlet opening;
   a counterelectrode associated with the at least partially electrically conductive diaphragm;
   a flexible printed circuit board or a star flexible printed circuit board; and
   an impedance converter, disposed on the flexible printed circuit board or the star flexible printed circuit board;
   wherein the counterelectrode is implemented as a printed circuit board having a carrier of insulating material and at least one electrically conductive surface on the carrier of insulating material, and
   wherein the printed circuit board serves for mechanical fixing and electrical connection of electronic components, and
   wherein the counterelectrode has a first side oriented towards the at least partially electrically conductive diaphragm and a second side oriented towards a rear section inside the housing, and
   wherein the flexible printed circuit board or the star flexible printed circuit board electrically contacts the second side of the counterelectrode so that an input of heat due to a soldering operation during production is kept away from the counterelectrode, and
   wherein the flexible printed circuit board or the star flexible printed circuit board is arranged in the rear section inside the housing.

2. The microphone capsule as set forth in claim 1, wherein the carrier of insulating material is made of ceramic.

3. A capacitor microphone having the microphone capsule as set forth in claim 1.

4. An electrical device having the capacitor microphone as set forth in claim 3.

* * * * *

UNITED STATES PATENT AND TRADEMARK OFFICE
CERTIFICATE OF CORRECTION

PATENT NO. : 8,818,004 B2
APPLICATION NO. : 12/921772
DATED : August 26, 2014
INVENTOR(S) : Rosen et al.

Page 1 of 1

It is certified that error appears in the above-identified patent and that said Letters Patent is hereby corrected as shown below:

On the Title Page, second column, item 57, line 5 of the ABSTRACT: please delete "(21)" and insert --(121)--

Signed and Sealed this
Twenty-third Day of December, 2014

Michelle K. Lee
*Deputy Director of the United States Patent and Trademark Office*